United States Patent [19]

Nakai et al.

[11] Patent Number: 4,862,099
[45] Date of Patent: Aug. 29, 1989

[54] DIGITAL FM DEMODULATOR WITH DISTORTION CORRECTION

[75] Inventors: Takahiro Nakai; Keiji Hatanaka; Yoshiko Hatano, all of Nagaokakyo, Japan

[73] Assignee: Mitsubishi Denki Kabushiki Kaisha, Tokyo, Japan

[21] Appl. No.: 233,143

[22] Filed: Aug. 17, 1988

[30] Foreign Application Priority Data

Aug. 18, 1987 [JP] Japan .................. 62-205517

[51] Int. Cl.$^4$ ............................................. H03D 3/00
[52] U.S. Cl. ...................................... 329/126; 329/145;
358/327; 358/330; 358/23; 360/30
[58] Field of Search ............... 329/104, 107, 110, 126, 329/145; 455/214; 375/80; 358/327, 330, 23; 360/30

[56] References Cited

U.S. PATENT DOCUMENTS 4,455,533 6/1984 Moraillon .................. 329/126

OTHER PUBLICATIONS

"Experiments on VTR Digital Signal Processing"; Karou Kobayashi; pp. 355-361, IEEE Transactions on Consumer Electronics, vol. CE-32, No. 3, Aug. 1986.

Primary Examiner—Siegfried H. Grimm
Attorney, Agent, or Firm—Birch, Stewart, Kolasch & Birch

[57] ABSTRACT

A frequency demodulator includes an analog-to-digital converter for converting an inputted FM signal into a digital signal. A 90° phase shifter is used to phase shift the converted digital signal. The phase shifted signal and the converted signal are utilized to determine the results of $\tan^{-1}(X/Y)$. X represents the converted signal, and Y represents the phase shifted signal. The result from the calculation is delayed for a period of time equal to one sampling cycle. The frequency demodulator also includes a subtractor for subtracting the delayed signal from the calculation result. A discontinuity corrector corrects any discontinuity in an output from the subtractor, and a reversal phenomenon compensator compensates the output from the discontinuity corrector when the output from the discontinuity corrector exceeds a predetermined range of levels. These levels correspond to an appearance of discrete lines of black or white color on a reproduced picture.

3 Claims, 2 Drawing Sheets

DIGITAL FM DEMODULATOR WITH DISTORTION CORRECTION

BACKGROUND OF THE INVENTION 1. (Field of the Invention)

The present invention relates to a frequency demodulator used in, for example, a video tape recorder, for further demodulating a signal that has been converted from an analog frequency-modulated (FM) signal into a digital signal.

2. (Description of the Prior Art)

It is well known that when an analog FM signal X(t) at a certain time t is frequency-demodulated, the resultant frequency-demodulated signal F(t) has the following relationship:

$$F(t) = \frac{d}{dt} \tan^{-1}[X(t)/Y(t)] \quad (1)$$

wherein Y(t) represents the analog FM signal which is shifted 90° in phase from the phase of the analog FM signal X(t) at the certain time t. The term $\tan^{-1}[X(t)/Y(t)]$ of equation (1) is descriptive of the phase of the frequency-modulated wave, and when this term of the equation (1) is expressed by $\phi(t)$, equation (1) can be rewritten as follows:

$$F(t) = \frac{d}{dt} \phi(t) \quad (2)$$

FIG. 3 of the accompanying drawings illustrates a prior art frequency demodulator which utilizes a digital signal processing technology that permits it to operate according to the equation (2).

Referring now to FIG. 3 the frequency demodulator comprises an analog-to-digital converter 1 having a sampling cycle T for converting an inputted analog FM signal into a digital signal. The digital FM signal outputted from the analog-to-digital converter 1 is supplied to a 90° phase shifter 3 which phase shifts the digital FM signal by 90° relative to the input to the phase shifter 3, thereby providing signal Y. The digital FM signal outputted from the analog-to-digital converter 1 is also supplied to a delay compensator 2 for delaying the input digital FM signal for a length of time during which the digital FM signal applied to the phase shifter 3 is shifted in phase. This delay circuit provides a delayed digital FM signal X. The delayed digital FM signal X and the phase-shifted digital FM signal Y are recognized as signals which have been quantified at the same time. Both the delayed and phase-shifted digital FM signals X and Y from the delay compensator 2 and the phase shifter 3, respectively, are applied to a calculator 4 adapted to perform a calculation of $\tan^{-1}(X/Y)$ with respect to both of these input signals X and Y. An output from the calculator 4 is applied in part to a delay circuit 5 for delaying the output from the calculator 4 for a length of time equal to one sampling cycle T, and in part to a subtractor 6 for subtracting the delayed output of the delay circuit 5 from the output of the calculator 4.

Specifically, the calculator 4 used in the prior art frequency demodulator utilizes a read-only memory which is addressable by the delayed and phase-shifted digital FM signals X and Y. The memory stores, as memory content, the arc tangent ($\tan^{-1}$) values associated with (X/Y). With this construction, the calculator can provide, as an output, a signal representative of $\tan^{-1}(X/Y)$ in response to the delayed and phase-shifted digital FM signals X and Y received from the delay compensator 2 and the phase shifter 3, respectively.

The output from the calculator 4 represents the function $\phi(K.T)$ the frequency modulated wave at time $t = K.T$ as described above. For the purpose of simplification, if the function $\phi(K.T)$ is expressed by $\phi(K)$ (Hereinafter, other than $\phi(K)$, a similar nomenclature is employed), the output from the delay circuit 5 is expressed by $\phi(K-1)$ and the output from the subtractor 6 is expressed by $\phi(K)-\phi(K-1)$. This difference is expressed by $\Delta\phi(K)$.

Where the sampling cycle T is sufficiently small, the equation (2) above can be approximated as follows:

$$F(K) \approx [\Delta\phi(K)]/T \quad (3)$$

Since the sampling cycle T is fixed, as is understood from the equation (3) above, the output $\Delta\phi(K)$ from the subtractor 6 is similar to the demodulated signal F(K), and in this sense, the output from the subtractor can be regarded as a demodulated signal.

However, the arc tangent is a cyclic function, and assuming that when the cycle is $2\pi$ with due regard paid to the sign taken by each of the delayed and phase-shifted digital FM signals X and Y, a table in the read-only memory has values from zero to $2\pi$. When $\phi(K-1)$ and $\phi(K)$ are $1.9\pi$ and $2.1\pi$, respectively, as true outputs of $\tan^{-1}(X/Y)$, the output from the calculator 4 is such that $\phi(K-1)$ remains unchanged, that is, $\phi(K-1) = 1.9\pi$, and $\phi(K)$ will become $0.1\pi$. Therefore, a problem tends to occur in that the output from the subtractor 6, that is, $[\phi(K)-\phi(K-1)]$, may take a negative value $(-1.8\pi)$, thereby inviting a discontinuity in the output.

In view of the foregoing problem, a discontinuity corrector 7 is employed for performing a correction such that when the output from the subtractor 6 takes a negative value, $2\pi$ is added to the negative output from the subtractor 6. With this discontinuity corrector 7, whenever the output from the subtractor 6 takes a negative value, the discontinuity corrector 7 can provide properly corrected outputs from the subtractor 6 with no discontinuity. The output from the discontinuity corrector 7 is expressed by S1(K). When the output from the discontinuity corrector 7 is subsequently converted by a digital-to-analog converter 9, the frequency demodulated signal, which is the input signal whose frequency has been demodulated, can be obtained.

It has, however, been found that the prior art frequency demodulator shown in FIG. 3 has a problem. In particular, when the input FM signal supplied to the analog-to-digital converter 1 is an unbalanced frequency modulated wave generally used in a luminance signal reproduction system such as a home video tape recorder and an upper side-band of the FM wave is suppressed and a lower side-band of the same FM wave is enhanced, it has been experimentally found that the frequency demodulated signal outputted from the frequency demodulator often jumps out of a permissible tolerance level with the consequence that the demodulated output is reversed to the black or white side. If this frequency modulated wave is outputted through the digital-to-analog converter and is then reproduced on a screen of a cathode ray tube, discrete lines of black or white color extending along the horizontal scanning lines appear, thereby creating a problem associated with the reproduced picture on the screen.

SUMMARY OF THE INVENTION

The present invention has been developed to substantially eliminate the above discussed problems which reside in the prior art frequency demodulator and has for its primary object to provide an improved frequency demodulator which is effective in ensuring the reproduced pictures are substantially free from an appearance of discrete lines of black and white colors even when the FM wave exceeds a predetermined level.

The above described object of the present invention can be realized by providing an improved frequency demodulator which comprises an analog-to-digital converter for converting the received FM signal into a digital signal; a 90° phase shifter for shifting the phase of the converted digital signal 90°; a calculator for performing a calculation of $\tan^{-1}(X/Y)$ wherein X represents the output from the analog-to-digital converter and Y represents an output from the 90° phase shifter; a first delay circuit for delaying an output from the calculator for a period of time equal to one sampling cycle T; a subtractor for subtracting the output from the first delay circuit from the output of the calculator; a discontinuity corrector for correcting the discontinuity of an output from the subtractor; and a reversal phenomenon compensator for compensating an output from the discontinuity corrector when the output from the discontinuity corrector exceeds a predetermined range of levels corresponding to an appearance of the discrete lines of black or white color on a reproduced picture, thereby providing a demodulated output within the predetermined range of levels.

In the frequency demodulator as described above, in accordance with the present invention, when the FM wave whose upper and lower side-bands are unbalanced with each other is inputted to the frequency demodulator, the output from the discontinuity corrector can be compensated by the reversal phenomenon compensator by utilizing the fact that the output from the discontinuity corrector exceeds the predetermined level range. Therefore, the demodulated output becomes proper and any possibility that the reproduced picture on the screen of the cathode ray tube may have the discrete lines of black of white color can be advantageously minimized.

BRIEF DESCRIPTION OF THE DRAWINGS

The present invention will become more clearly understood from the following description of a preferred embodiment thereof, when taken in conjunction with the accompanying drawings. However, the embodiment and the drawings are given only for the purpose of illustration and explanation, and are not to be taken as limiting the scope of the present invention in any way whatsoever, which scope is to be determined solely by the appended claims. In the drawings, like reference numerals denote like parts in the several views, and:

DETAILED DESCRIPTION OF THE EMBODIMENTS

Figure 1:
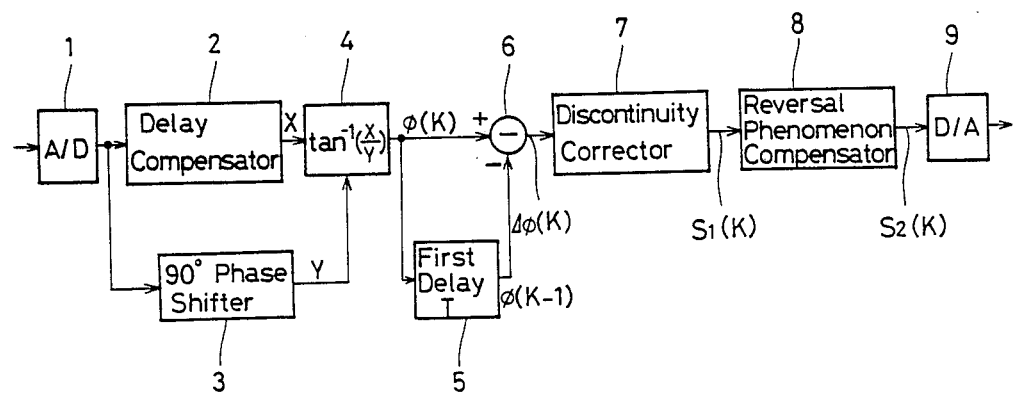
FIG. 1 is a block circuit diagram showing a frequency demodulator of the present invention.

A frequency demodulator according to one preferred embodiment of the present invention and as shown in FIG. 1 comprises an analog-to-digital converter 1 for converting an inputted analog FM signal into a digital signal. The digital FM signal outputted from the analog-to-digital converter 1 is supplied to a 90° phase shifter 3 which shifts the phase of the digital FM signal by 90° relative to the input of the phase shifter 3, and thereby provides a signal Y. The digital FM signal outputted from the analog-to-digital converter 1 is also supplied to a delay compensator 2 for delaying the input digital FM signal for a length of delay time during which the digital FM signal applied to the phase shifter 3 is shifted in phase and for providing a delayed digital FM signal X matched in phase with that of the 90° phase-shifted output from the phase shifter 3. Both the delayed and phase-shifted digital FM signals X and Y from the delay compensator 2 and the phase shifter 3, respectively, are applied to a calculator 4 for performing a calculation of $\tan^{-1}(X/Y)$ with respect to both input signals X and Y. An output from the calculator 4 is applied in part to a first delay circuit 5 for delaying the output from the calculator 4 and in part to a subtractor 6 for subtracting the delayed output of the delay circuit 5 from the output of the calculator 4. An output from the subtractor 6 is supplied to a discontinuity corrector 7 for correcting the discontinuity of the output from the subtractor 6. This circuit arrangement is generally identical with that of the prior art frequency demodulator shown in and described with reference to FIG. 3.

In accordance with the present invention, an output from the discontinuity corrector 7 is connected to a reversal phenomenon compensator 8 operable, when the output from the discontinuity corrector 7 exceeds a predetermined level corresponding to an appearance discrete lines of black or white color on a reproduced picture, for automatically compensating the output from the discontinuity corrector 7 so that the discrete lines of black or white color will no longer be visible. An output from the reversal phenomenon compensator 8 is supplied to a digital-to-analog converter 9 for the conversion of the digital output of the reversal phenomenon compensator 8 into an analog signal which is the frequency demodulated signal.

The frequency demodulator of theabove described construction according to the present invention operates in the following manner.

The FM signal digitalized by the analog-to-digital converter 1 is inputted to the delay compensator 2 and also to the 90° phase shifter 3 for phase shifting the digitalized FM signal 90°. The delayed FM signal X emerging from the delay compensator 2 and the 90° phase-shifted FM signal Y emerging from the phase shifter 3 are inputted to the calculator 4 at which both are processed to provide the calculated output representative of the following value:

$$\tan^{-1}(X/Y)$$

The output from the calculator 4 is then supplied to the subtractor 6 and also to the first delay circuit 5. The subtractor 6 outputs, as is the case with that used in the prior art frequency demodulator shown in FIG. 3, an output representative of $\Delta\phi(K.T)$ corresponding to the demodulated output F(t) expressed by the following equation:

$$F(t) = \frac{d}{dt} \tan^{-1}[X(t)/Y(t)]$$

Figure 3:
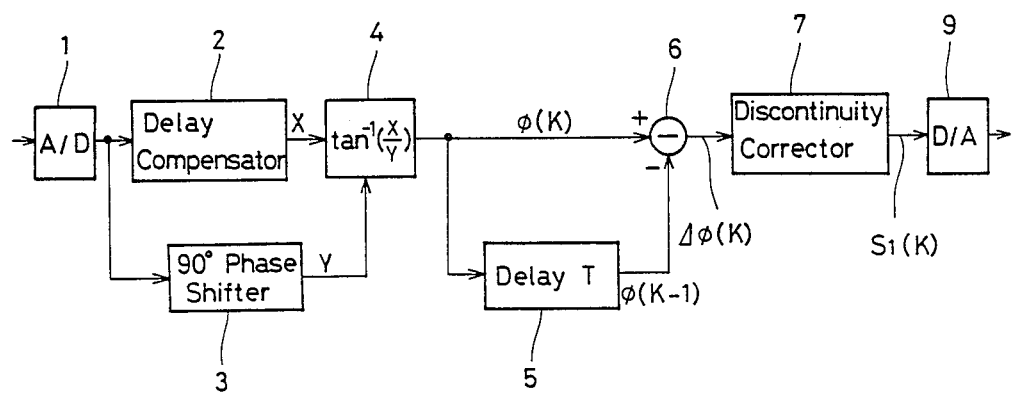
FIG. 3 is a block circuit diagram showing the prior art frequency demodulator.

As is the case with that shown in FIG. 3, the output from the subtractor 6 is corrected by the discontinuity corrector 7 in order to correct the discontinuity of the output from the subtractor 6 which results from the fact that the arc tangent is a cyclic function. In other words, only when the output from the subtractor 6 takes a negative value, the discontinuity corrector 7 outputs a signal corresponding to the output from the subtractor 6 to which $2\pi$ has been added.

The operation of the frequency demodulator so far described is identical with that described with reference to FIG. 3. However, in the frequency demodulator according to the present invention and shown in FIG. 1, the output from the discontinuity corrector 7 is not applied directly to the digital-to-analog converter 9 as a demodulated output. In other words, the frequency demodulator, according to the present invention, modifies the output from the discontinuity corrector 7 by a compensation process.

In the case of the video tape recorder, since the instantaneous maximum and minimum frequency values of the FM signal are fixed according to the frequency allocation of the FM signal and if the sampling frequency fs is given, the range of increment S1(K) (identical with the output from the discontinuity corrector 7) of the phase of the FM signal is theoretically determined if the FM wave is ideally reproduced. By way of example, in the case of the video tape recorder operating according to the S-VHS scheme, when the FM carrier frequency is fixed at 4.5 MHz at a sync tip and at 7.0 MHz at 100% white, the maximum instantaneous frequency occurs at 210% white clip with the consequence of f1 = 8.76 MHz whereas the minimum instantenous frequency occurs at −70% dark clip with the consequence of f2=4.28 MHz. Accordingly, if the sampling frequency fs is, for example, 14.3 MHz, the increment S1(K) of the phase during one sampling cycle T (T=1/fs) is S1A=$2\pi$.f1.T (rad) at maximum and is S1B=$2\pi$.f2.T (rad) at minimum. In other word, if the FM wave is ideal, S1(K) falls within the range of S1A to S1B (rad). In reality, however, the FM wave during the reproduction is not ideal, and therefore, the FM wave tends to deviate from the above mentioned range of S1A to S1B (rad). In view of the foregoing, considering this deviation of the actual FM wave from the range of S1A to S1B, a range of S1C to S1D (rad) which is broader than the range of S1A to S1B (rad) can be considered an appropriate demodulating range. If the output from the discontinuity corrector 7 does not fall within the range of S1C to S1D (rad), it means that a correction of the output is needed from the discontinuity corrector 7, and therefore, the output from the discontinuity corrector 7 is interpolated with a value neighboring the value of the output from the discontinuity corrector 7. The details of one example of the reversal phenomenon compensator 8 used for this purpose are illustrated in FIG. 2.

Figure 2:
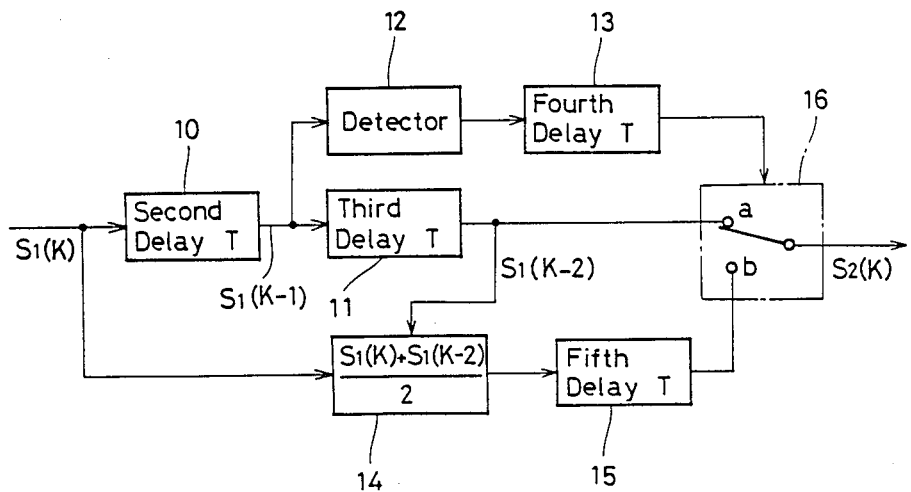
FIG. 2 is a block circuit diagram showing the details of a reversal phenomenon compensator used in the frequency demodulator of the present invention.

Referring now to FIG. 2, reference numerals 10, 11, 13 and 15 represent second to fifth delay circuits, respectively, each having a delay time equal to the length of time T corresponding to one sampling cycle. Reference numeral 12 represents a detector for detecting whether or not the output from the discontinuity corrector 7 has exceeded the predetermined level range, and reference numeral 14 represents an averaging calculator for summing the respective outputs from the discontinuity corrector 7 and the third delay circuit 11 together and for outputting an output signal indicative of the result (i.e., an average value) of division by 2 of the sum of the respective outputs from the discontinuity corrector 7 and the third delay circuit 11. Reference numeral 16 represents a switch capable of assuming one of two different operative states depending on the applied output from the detector 12 through the fourth delay circuit 13.

Assuming that the value outputted from the discontinuity corrector 7 shown in FIG. 1 is expressed by S1(K), the values outputted from the second and third delay circuits 10 and 11 shown in FIG. 2 can be expressed S1(K−1) and S1(K−2), respectively. The output S1(K−1) from the second delay circuit 10 is inputted to the detector 12 at which determination is made to detect whether or not the output S1(K−1) has exceeded the predetermined level range of S1C to S1D (rad). If the output S1(K−1) has exceeded the predetermined level range or if the output S1(K−1) has not exceeded the predetermined level range, the detector 12 outputs a high level signal or a low level signal, respectively. This output signal from the detector 12 is in turn supplied to the fourth delay circuit 13.

On the other hand, the output S1(K) from the discontinuity corrector 7 and the output S1(K−2) from the third delay circuit 11 are inputted to the averaging calculator 14 by which the average value, [S1(K)+S1(K−2)]/2, is calculated. An output from the averaging calculator 14 representing the averaging calculation is inputted to the fifth delay circuit 15.

The switch 16 can assume one of the two operative states. More specifically, when the output from the fourth delay circuit 13 is in a high level state, the switch 16 is in a first operative state with its movable contact engaged to one of the fixed contacts designated by b, thereby allowing the passage of the output from the fifth delay circuit 15. On the other hand, when the output from the fourth delay circuit 13 is in a low level state, the switch 16 is in a second operative state with its movable contact engaged to the other of the fixed contacts designated by a, thereby allowing the passage of the output S1(K−2) from the third delay circuit 11.

Accordingly, assuming that the output S1(K−1) has exceeded the predetermined level range and the high level signal is applied from the detector 12 to the fourth delay circuit 13, a high level signal is outputted from the fourth delay circuit 13 during the next succeeding timing and is then applied to the switch 16 to cause it to realize the first operative state. In this condition, therefore, the output from the fifth delay circuit 15, that is, the signal indicative of the the average value [S1(K)+S1(K−2)]/2 calculated by the averaging calculator 14 which has been delayed by the fifth delay circuit 15, is allowed to pass through the switch 16 to the digital-to-analog converter 9 for the conversion into the analog signal.

On the other hand, if the output S1(K−1) falls within the predetermined level range and the output from the detector 12 therefore is a low level state, the fourth delay circuit 13 outputs during the next succeeding timing the low level signal which is in turn supplied to the switch 16 to cause it to realize the second operative state. When the switch 16 assumes the second operative state in the manner described above, the output S1(K−2) from the delay circuit 11 is allowed to pass through the switch 16 to the digital-to-analog converter 9 for the conversion into the analog signal.

As described above, in the present invention, if the output from the discontinuity corrector 7 is within the predetermined level range, the frequency demodulator, according to the present invention, outputs the output from the discontinuity corrector 7 as the demodulated output. However, when the output from the discontinuity corrector 7 deviates from the predetermined level range, the output from the discontinuity corrector 7 is corrected in such a way as to determine the average value representing the sum of the value of the output from the discontinuity corrector 7 plus the value neighboring such value of the output from the discontinuity corrector 7 divided by 2, so that the frequency demodulator, according to the present invention, can output the average value referred to above.

In the foregoing embodiment, if the output from the discontinuity corrector 7 deviates from the predetermined level range, the average value is determined by dividing the sum of the value of the output from the discontinuity corrector 7 plus the value neighboring such value of the output from the discontinuity corrector 7 by 2 before the frequency demodulator of the present invention outputs the demodulated signal. However, an alternative method may be employed wherein, instead of the determination of the average value, a value corresponding to data preceding 1 H period or corresponding to a predetermined gray level is outputted.

It is to be noted that, although in the foregoing embodiment reference has been made to the level range of S1C to S1D (rad) as a threshold value for the determination of the need of compensation by the reversal phenomenon compensator 8, it should be determined in consideration of the frequency allocation of the FM wave and the sampling frequency, both fixed for a particular system of the video tape recorder, and the stability of the reproduced FM wave.

Also, it is to be noted that, although in the foregoing embodiment the delay compensator 2 has been shown and described as employed, this delay compensator 2 may be dispensed with if no delay occurs in the 90° phase shifter 3.

As fully described above, and according to the present invention, when the output from the discontinuity corrector exceeds the predetermined level corresponding to the appearance of the discrete lines of black or white color on the reproduced picture, the excess of the output from the discontinuity corrector over the predetermined level is detected and is then corrected so that the proper demodulated output can be obtained. Therefore, a picture free from any possible appearance of the discrete lines of black or white color can be obtained on the screen of the cathode ray tube.

Although the present invention has fully been described in connection with the preferred embodiments with reference to the accompanying drawings, used only for the purpose of illustration, those skilled in the art will readily conceive numerous changes and modifications within the framework of obviousness upon the reading of the specification presented for the present invention. Accordingly, such changes and modifications are, unless they depart from the spirit and scope of the present invention as defined by the claims annexed hereto, to be construed as included therein.

What is claimed is:

1. A frequency demodulator comprising:
   analog-to-digital converter means for converting an inputted FM signal into a digital FM signal;
   90° phase shifter means, operatively connected to said analog-to-digital converter means, for phase shifting the converted digital signal 90°;
   calculator means, operatively connected to said analog-to-digital converter means and said 90° phase shifter means, for performing a calculation of $\tan^{-1}(X/Y)$ wherein X represents an output from said analog-to-digital converter means and Y represents an output from said 90° phase shifter means;
   first delay means, operatively connected to said calculator means, for delaying an output from the calculator means for a period of time equal to one sampling cycle;
   subtractor means, operatively connected to said calculator means and said first delay means, for subtracting an output of said first delay means from said output of said calculator means;
   discontinuity corrector means, operatively connected to said subtractor means, for correcting a discontinuity in an output from said subtractor means; and
   reversal phenomenon compensator means, operatively connected to said discontinuity corrector means, for correcting an output from said discontinuity corrector means when said output from said discontinuity corrector means exceeds a predetermined range of levels corresponding to an appearance of discrete lines of black or white color on a reproduced picture, thereby providing a demodulated output within said predetermined range of levels.

2. The frequency demodulator as claimed in claim 1, wherein said reversal phenomenon compensator means comprises:
   detector means for detecting whether or not a level of said output from said discontinuity corrector means deviates from a predetermined level range;
   averaging calculator means, operatively connected to said discontinuity corrector means, for calculating an average value of neighboring values of said output from said discontinuity corrector means; and
   switching means for assuming either a first or a second operative state according to an output from said detector means;
   said switching means assuming said first operative state when said output from said discontinuity corrector means as detected by said detector means falls within said predetermined level range, thereby allowing said output from said discontinuity corrector means to be said demodulated output;
   said switching means assuming said second operative state when said output from said discontinuity corrector means as detected by said detector means deviates from said predetermined level range, thereby causing an output from said averaging calculator means to be said demodulated signal.

3. The frequency demodulator as claimed in claim 2, wherein said reversal phenomenon compensator means further comprises:
   second delay means for delaying said output from said discontinuity corrector means for a period of time equal to one sampling cycle and for outputting a delayed signal to said detector means;

third delay means for delaying said output from said second delay means for a period of time equal to one sampling cycle;

fourth delay means for delaying said output from said detector means for a period of time equal to one sampling cycle; and fifth delay means for delaying said output from said averaging calculator means for the period of time equal to one sampling cycle;

wherein said averaging calculator means calculates an average value of the outputs from said discontinuity corrector means and said third delay means;

said switching means, in response to said output from said detector means, selectively allowing one of the outputs from said third delay means and said fifth delay means to be said demodulated output.

* * * * *